(12) United States Patent
Ho

(10) Patent No.: US 10,547,136 B2
(45) Date of Patent: Jan. 28, 2020

(54) ELECTRICAL CONNECTOR

(71) Applicant: LOTES CO., LTD, Keelung (TW)

(72) Inventor: Chien Chih Ho, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/242,381

(22) Filed: Jan. 8, 2019

(65) Prior Publication Data

US 2019/0214761 A1   Jul. 11, 2019

(30) Foreign Application Priority Data

Jan. 9, 2018   (CN) .......................... 2018 1 0019843
Dec. 10, 2018  (CN) .......................... 2018 1 1501709

(51) Int. Cl.
| | |
|---|---|
| *H01R 13/24* | (2006.01) |
| *H01R 13/6473* | (2011.01) |
| *H01R 13/40* | (2006.01) |
| *H01R 12/55* | (2011.01) |
| *H01R 12/70* | (2011.01) |

(Continued)

(52) U.S. Cl.
CPC ......... *H01R 13/2464* (2013.01); *H01R 12/52* (2013.01); *H01R 12/55* (2013.01); *H01R 12/7076* (2013.01); *H01R 12/714* (2013.01); *H01R 13/2457* (2013.01); *H01R 13/2492* (2013.01); *H01R 13/40* (2013.01); *H01R 13/502* (2013.01); *H01R 13/514* (2013.01); *H01R 13/6473* (2013.01); *H05K 7/1069* (2013.01)

(58) Field of Classification Search
CPC .......................... H01R 13/2442; H01R 12/714
See application file for complete search history.

(56) References Cited

U.S. PATENT DOCUMENTS

| | | | | |
|---|---|---|---|---|
| 3,923,365 A | * | 12/1975 | Lynch .................... | H01R 13/41 |
| | | | | 439/751 |
| 4,429,459 A | * | 2/1984 | Lynch .................... | H01R 12/58 |
| | | | | 29/881 |

(Continued)

FOREIGN PATENT DOCUMENTS

| | | |
|---|---|---|
| CN | 101316023 B | 3/2011 |
| CN | 202997100 U | 6/2013 |

(Continued)

*Primary Examiner* — Ross N Gushi
(74) *Attorney, Agent, or Firm* — Locke Lord LLP; Tim Tingkang Xia, Esq.

(57) ABSTRACT

An electrical connector includes an insulating body and multiple terminals. The insulating body has multiple terminal holes running through an upper surface and a lower surface thereof. Each terminal has a connecting portion correspondingly located in a corresponding terminal hole, a conducting portion extending from the connecting portion, an elastic arm formed by bending upward and extending from the connecting portion upward out of the corresponding terminal hole, and a contact portion bending upward and extending from the elastic arm. When a chip module is pressed downward, a bottom surface of each conductive sheet of a circuit board downward abuts a top surface of the contact portion, and the elastic arm deforms downward. The contact portion, the elastic arm, the connecting portion and the conducting portion are integrally formed. A thickness of the connecting portion is greater than a thickness of the contact portion.

20 Claims, 13 Drawing Sheets

(51) Int. Cl.
*H01R 12/71* (2011.01)
*H01R 13/502* (2006.01)
*H01R 13/514* (2006.01)
*H01R 12/52* (2011.01)
*H05K 7/10* (2006.01)

(56) References Cited

U.S. PATENT DOCUMENTS

| | | | | |
|---|---|---|---|---|
| 4,940,432 A * | 7/1990 | Consoli | H01R 13/22 | 439/330 |
| 4,998,886 A * | 3/1991 | Werner | H01R 13/2428 | 439/631 |
| 5,090,116 A * | 2/1992 | Henschen | B23K 3/0475 | 29/827 |
| 5,498,166 A * | 3/1996 | Rothenberger | H01R 13/5202 | 439/66 |
| 5,916,000 A * | 6/1999 | Feldmeier | H01R 12/585 | 439/751 |
| 6,022,248 A * | 2/2000 | Wu | H01M 2/20 | 439/862 |
| 6,071,152 A * | 6/2000 | Achammer | H01R 13/41 | 439/733.1 |
| 6,176,707 B1 * | 1/2001 | Neidich | H01R 13/2435 | 439/66 |
| 6,186,797 B1 * | 2/2001 | Wang | H01R 13/2435 | 439/66 |
| 6,203,329 B1 * | 3/2001 | Johnson | H01R 12/714 | 439/66 |
| 6,220,869 B1 * | 4/2001 | Grant | H01R 13/2435 | 439/66 |
| 6,290,507 B1 * | 9/2001 | Neidich | H01R 13/2435 | 439/66 |
| 6,312,296 B1 * | 11/2001 | Jones | H01R 12/585 | 439/733.1 |
| 6,315,621 B1 * | 11/2001 | Natori | H01R 13/2428 | 439/862 |
| 6,343,940 B1 * | 2/2002 | Khoury | G01R 1/06716 | 257/E23.004 |
| 6,540,526 B2 * | 4/2003 | Toda | H01R 13/2442 | 439/66 |
| 6,604,950 B2 * | 8/2003 | Maldonado | H05K 7/1069 | 439/591 |
| 6,702,594 B2 * | 3/2004 | Lee | H01R 4/028 | 439/70 |
| 6,719,567 B2 * | 4/2004 | Billman | H01R 12/714 | 439/65 |
| 6,730,134 B2 * | 5/2004 | Neidich | H01R 13/2435 | 29/25.01 |
| 6,733,303 B2 * | 5/2004 | Maldonado | H05K 7/1069 | 439/66 |
| 6,866,520 B2 * | 3/2005 | Chiang | H05K 7/1069 | 439/66 |
| 6,877,992 B2 * | 4/2005 | Grant | H01R 13/2435 | 439/591 |
| 6,881,070 B2 * | 4/2005 | Chiang | H01R 13/2435 | 439/66 |
| 6,929,483 B2 * | 8/2005 | Huang | H01R 13/2442 | 439/66 |
| 6,945,788 B2 * | 9/2005 | Trout | H05K 7/1069 | 439/66 |
| 6,955,572 B1 * | 10/2005 | Howell | H01R 13/2442 | 439/862 |
| 6,974,332 B2 * | 12/2005 | Ma | H01R 13/2421 | 439/66 |
| 6,976,888 B2 * | 12/2005 | Shirai | H01R 13/2442 | 439/733.1 |
| 6,994,565 B2 * | 2/2006 | Harper, Jr. | H01R 12/52 | 439/66 |
| 7,021,942 B2 * | 4/2006 | Grant | H01R 13/2435 | 439/591 |
| 7,037,113 B2 * | 5/2006 | Soh | H01R 12/714 | 439/66 |
| 7,048,549 B1 * | 5/2006 | Swain | H01R 13/2435 | 439/591 |
| 7,052,284 B2 * | 5/2006 | Liao | H01R 13/2435 | 439/66 |
| 7,094,066 B2 * | 8/2006 | Mendenhall | H01R 13/2435 | 439/66 |
| 7,134,880 B2 * | 11/2006 | Arai | H01R 13/2435 | 439/66 |
| 7,186,152 B2 * | 3/2007 | Chen | H01R 13/2442 | 439/733.1 |
| 7,258,550 B2 * | 8/2007 | Chen | H01R 13/2435 | 439/66 |
| 7,291,021 B2 * | 11/2007 | Shirai | H01R 13/2442 | 439/71 |
| 7,297,010 B2 * | 11/2007 | Tsai | H01R 13/2442 | 439/331 |
| 7,306,493 B2 * | 12/2007 | Seo | H01R 12/585 | 439/751 |
| 7,338,294 B2 * | 3/2008 | Polnyi | H01R 13/2421 | 439/66 |
| 7,361,022 B2 * | 4/2008 | Ju | H01R 13/2435 | 439/66 |
| 7,361,023 B2 * | 4/2008 | Wu | H01R 4/027 | 439/66 |
| 7,387,541 B1 * | 6/2008 | Lai | H01R 13/2442 | 439/660 |
| 7,402,049 B2 * | 7/2008 | Polnyi | H01R 12/714 | 439/66 |
| 7,422,442 B2 * | 9/2008 | Hsieh | H01R 13/2435 | 439/71 |
| 7,442,082 B2 * | 10/2008 | Ma | H01R 13/65802 | 439/607.01 |
| 7,445,460 B1 * | 11/2008 | Fan | H01R 13/40 | 439/66 |
| 7,445,518 B2 * | 11/2008 | Schneider | H01R 13/2428 | 439/700 |
| 7,497,743 B2 * | 3/2009 | Tsai | H01R 13/2442 | 439/862 |
| 7,497,744 B2 * | 3/2009 | Tsai | H01R 12/57 | 439/331 |
| 7,520,752 B2 * | 4/2009 | McAlonis | H01R 4/4809 | 439/66 |
| 7,527,536 B2 * | 5/2009 | Chiang | H01R 12/57 | 439/884 |
| 7,534,113 B2 * | 5/2009 | Liao | H01R 13/2442 | 439/83 |
| 7,544,107 B2 * | 6/2009 | Gattuso | H01R 12/57 | 439/862 |
| 7,556,502 B2 * | 7/2009 | Nakata | H01R 12/714 | 439/66 |
| 7,559,799 B2 * | 7/2009 | Ma | H01R 13/65802 | 439/607.01 |
| 7,559,811 B1 * | 7/2009 | Polnyi | H01R 4/4809 | 439/591 |
| 7,621,755 B2 * | 11/2009 | Kubo | H01R 13/2435 | 439/66 |
| 7,658,616 B2 * | 2/2010 | Hougham | H05K 3/326 | 439/66 |
| 7,695,288 B2 * | 4/2010 | Ma | H01R 12/57 | 439/70 |
| 7,791,443 B1 * | 9/2010 | Ju | H01R 12/52 | 336/107 |
| 7,988,501 B2 * | 8/2011 | Chang | H05K 7/1069 | 439/751 |
| 8,052,433 B2 * | 11/2011 | Yeh | H01R 13/24 | 439/83 |
| 8,052,434 B2 * | 11/2011 | Yeh | H01R 12/57 | 439/83 |
| 8,083,528 B2 * | 12/2011 | Sakairi | H01R 13/2435 | 439/66 |
| 8,096,836 B2 * | 1/2012 | Cheng | H01R 13/2435 | 439/626 |
| 8,123,574 B2 * | 2/2012 | Ma | H01R 13/2442 | 439/862 |
| 8,147,256 B2 * | 4/2012 | Jin | H01R 12/52 | 439/83 |

(56) References Cited

U.S. PATENT DOCUMENTS

| | | | |
|---|---|---|---|
| 8,172,623 B1* | 5/2012 | Zhu | H01R 13/2428 439/709 |
| 8,177,561 B2* | 5/2012 | Ouchi | H01R 13/2485 174/260 |
| 8,187,009 B2* | 5/2012 | Liao | H01R 12/57 439/83 |
| 8,267,725 B2* | 9/2012 | Zhu | H01R 13/41 439/660 |
| 8,277,230 B2* | 10/2012 | Huo | H01R 12/716 439/342 |
| 8,287,286 B2* | 10/2012 | Miwa | H01R 12/57 439/66 |
| 8,323,038 B2* | 12/2012 | Jin | H01R 12/714 439/66 |
| 8,360,790 B2* | 1/2013 | Ju | H01R 12/716 439/66 |
| 8,491,337 B2* | 7/2013 | Cai | H01R 12/57 439/607.28 |
| 8,512,049 B1* | 8/2013 | Huber | H01R 12/73 439/66 |
| 8,535,093 B1* | 9/2013 | Mason | H01R 13/6585 439/607.05 |
| 8,647,153 B2* | 2/2014 | Ju | H01R 12/714 439/626 |
| 8,708,716 B1* | 4/2014 | Ho | H01R 12/714 439/83 |
| 8,858,238 B2* | 10/2014 | Luo | H01R 12/7082 439/66 |
| 8,899,993 B2* | 12/2014 | Taylor | H05K 7/10 439/66 |
| 8,932,080 B2* | 1/2015 | Chang | H05K 7/1069 439/607.1 |
| 9,088,084 B2* | 7/2015 | Liao | H01R 13/41 |
| 9,106,022 B2* | 8/2015 | Cai | H01R 13/6471 |
| 9,142,932 B2* | 9/2015 | Liaw | H01R 12/57 |
| 9,172,161 B2* | 10/2015 | Walden | H01R 12/714 |
| 9,320,144 B2* | 4/2016 | Rathburn | H01R 12/57 |
| 9,604,300 B2* | 3/2017 | Ju | B23K 1/0056 |
| 9,806,450 B2* | 10/2017 | Liao | H01R 12/57 |
| 9,917,386 B1* | 3/2018 | Ju | H01R 12/52 |
| 9,954,312 B1* | 4/2018 | Ju | H01R 12/707 |
| 10,027,061 B2* | 7/2018 | Avery | H01R 13/405 |
| 10,062,982 B2* | 8/2018 | Ju | H01L 23/49816 |
| 10,084,252 B1* | 9/2018 | Ju | H01R 12/712 |
| 10,116,079 B1* | 10/2018 | Ju | H01R 12/57 |
| 10,116,080 B1* | 10/2018 | Ju | H01R 12/52 |
| 10,122,111 B1* | 11/2018 | Ju | H01R 12/7076 |
| 10,148,023 B1* | 12/2018 | Ju | H01R 12/714 |
| 10,148,024 B2* | 12/2018 | Ju | H01R 12/7082 |
| 10,148,026 B2* | 12/2018 | Pape | H01R 12/52 |
| 10,153,597 B1* | 12/2018 | Polinski | H01R 13/665 |
| 10,199,756 B2* | 2/2019 | Ju | H01R 13/2457 |
| 10,230,177 B2* | 3/2019 | Ju | H01R 13/2442 |
| 10,236,614 B2* | 3/2019 | Sugiyama | H01R 13/639 |
| 10,276,953 B2* | 4/2019 | Huang | H01R 12/57 |
| 10,276,956 B2* | 4/2019 | Huang | H01R 12/52 |
| 10,326,225 B2* | 6/2019 | Ju | H01R 12/7076 |
| 2003/0114029 A1* | 6/2003 | Lee | H01R 4/028 439/83 |
| 2004/0048523 A1* | 3/2004 | Huang | H01R 13/2435 439/862 |
| 2004/0266227 A1* | 12/2004 | Ma | H01R 9/096 439/71 |
| 2005/0070175 A1* | 3/2005 | Hashimoto | H05K 7/1061 439/862 |
| 2005/0112959 A1* | 5/2005 | Lai | H01R 13/2435 439/862 |
| 2005/0245106 A1* | 11/2005 | Ma | H01R 13/2442 439/66 |
| 2006/0046527 A1* | 3/2006 | Stone | H01R 13/2442 439/66 |
| 2006/0141870 A1* | 6/2006 | Milbrand, Jr. | H01R 13/5219 439/701 |
| 2007/0148998 A1* | 6/2007 | Liao | H01R 12/57 439/66 |
| 2007/0155196 A1* | 7/2007 | Cheng | H01R 13/2435 439/66 |
| 2009/0253287 A1* | 10/2009 | Polnyi | H01R 13/2435 439/331 |
| 2009/0269950 A1* | 10/2009 | Liao | H01R 13/2435 439/66 |
| 2009/0311900 A1* | 12/2009 | Liao | H05K 7/1069 439/331 |
| 2010/0267257 A1* | 10/2010 | Yeh | H01R 12/57 439/83 |
| 2012/0028502 A1* | 2/2012 | Yeh | H01R 12/57 439/626 |
| 2012/0100758 A1* | 4/2012 | Liaw | H01R 12/57 439/660 |
| 2012/0220169 A1* | 8/2012 | Uozumi | H01R 12/714 439/660 |
| 2012/0225586 A1* | 9/2012 | Tsai | H01R 13/2442 439/626 |
| 2013/0183861 A1* | 7/2013 | Chang | H05K 7/1069 439/607.35 |
| 2013/0237091 A1* | 9/2013 | Mason | H01R 13/6585 439/607.05 |
| 2013/0267124 A1* | 10/2013 | Chang | H01R 13/646 439/630 |
| 2014/0045350 A1* | 2/2014 | Taylor | H05K 7/10 439/66 |
| 2014/0162472 A1* | 6/2014 | Walden | H01R 12/714 439/66 |
| 2018/0301837 A1* | 10/2018 | Hoyack | H01R 12/73 |
| 2018/0375243 A1* | 12/2018 | Hsu | H01R 12/707 |
| 2019/0052021 A1* | 2/2019 | Hsu | H01R 13/2442 |
| 2019/0067837 A1* | 2/2019 | Ju | H01R 4/02 |
| 2019/0089098 A1* | 3/2019 | Cheng | H01R 13/6471 |
| 2019/0097334 A1* | 3/2019 | Cheng | H01R 12/7076 |
| 2019/0103687 A1* | 4/2019 | Murtagian | H01R 12/7076 |
| 2019/0137545 A1* | 5/2019 | Reischl | G01R 1/0466 |
| 2019/0140382 A1* | 5/2019 | Ju | H01R 13/2457 |
| 2019/0173205 A1* | 6/2019 | Ju | H01R 12/7082 |
| 2019/0173206 A1* | 6/2019 | Ju | H01R 12/712 |
| 2019/0190207 A1* | 6/2019 | Ju | H01R 12/57 |

FOREIGN PATENT DOCUMENTS

| | | |
|---|---|---|
| CN | 204088669 U | 1/2015 |
| CN | 205828737 U | 12/2016 |
| CN | 206712072 U | 12/2017 |
| TW | 201308787 A | 2/2013 |
| TW | M551357 U | 11/2017 |

* cited by examiner

ELECTRICAL CONNECTOR

CROSS-REFERENCE TO RELATED PATENT APPLICATION

This non-provisional application claims priority to and the benefit of, pursuant to 35 U.S.C. § 119(a), patent application Serial No. CN201810019843.4 filed in China on Jan. 9, 2018, and patent application Serial No. CN201811501709.4 filed in China on Dec. 10, 2018. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to an electrical connector with improved high-frequency performance.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The Chinese patent CN201420377264.4 discloses an electrical connector, including an insulating body and a plurality of terminals disposed on the insulating body. Each terminal has a contact arm. The contact arm has an assembling portion, an elastic portion bending upward and extending from the assembling portion to be in contact with a chip module, and a strip connecting portion assembled on the contact arm. A lower end of the strip connecting portion is connected to the assembling portion, and an upper end of the strip connecting portion is used to be connected to a strip. However, the strip connecting portion and the contact arm need to be assembled and matched, such that the production period is prolonged. Further, the strip connecting portion easily collides with the contact arm, such that the terminal may break and the defective rate is increased. More importantly, a new contact interface is formed between the strip connecting portion and the contact arm, such that the terminal has too high impedance and poor high-frequency performance.

Therefore, a heretofore unaddressed need to design a new electrical connector exists in the art to address the aforementioned deficiencies and inadequacies.

SUMMARY

In view of the above deficiencies, the present invention is directed to an electrical connector in which all parts of terminals have different thicknesses to reduce the impedance of the terminals so as to improve the high-frequency performance.

To achieve the foregoing objective, the present invention adopts the following technical solutions.

An electrical connector is configured to electrically connect a chip module having a plurality of conductive sheets to a circuit board. The electrical connector includes: an insulating body, having an upper surface and a lower surface opposite to each other and a plurality of terminal holes running through the upper surface and the lower surface, wherein the upper surface faces the chip module, and the lower surface faces the circuit board; and a plurality of terminals, wherein each of the terminals has a connecting portion correspondingly located in a corresponding one of the terminal holes, a conducting portion formed by extending from the connecting portion and configured to conduct the circuit board, an elastic arm formed by bending upward and extending from the connecting portion and extending upward out of the corresponding one of the terminal holes, and a contact portion formed by bending upward and extending from the elastic arm, and wherein when the chip module is pressed downward, a bottom surface of each of the conductive sheets downward abuts a top surface of the contact portion, and the elastic arm is compressed and deforms downward; wherein the contact portion, the elastic arm, the connecting portion and the conducting portion are integrally formed, and a thickness of the connecting portion is greater than a thickness of the contact portion.

In certain embodiments, the thickness of the connecting portion is greater than a thickness of the elastic arm.

In certain embodiments, the thickness of the connecting portion is greater than a thickness of the conducting portion.

In certain embodiments, the circuit board is provided with a plurality of insertion holes, each of the insertion holes corresponds to the conducting portion of one of the terminals, and the conducting portion of each of the terminals is a fish-eye structure and is in interference fit with a corresponding one of the insertion holes.

In certain embodiments, the connecting portion has a main body portion and a protruding portion protruding from the main body portion along a thickness direction of the main body portion, the elastic arm bends upward and extends from the main body portion, and a thickness of the main body portion is equal to a thickness of the elastic arm.

In certain embodiments, a thickness of the protruding portion is greater than the thickness of the main body portion.

In certain embodiments, a top end of the protruding portion is lower than a top end of the main body portion, and the thickness of the main body portion is equal to the thickness of the contact portion and a thickness of the conducting portion.

In certain embodiments, in a side projection of the connecting portion, a longitudinal axis of the protruding portion passes through the elastic arm.

In certain embodiments, the protruding portion is clamped between the main body portion and a side wall of the corresponding one of the terminal holes, and a gap is formed between the protruding portion and the side wall.

In certain embodiments, a strip connecting portion is formed by extending from the main body portion to be connected to a strip, and the strip connecting portion as a whole is higher than the protruding portion.

In certain embodiments, in a side projection of the connecting portion, a longitudinal axis of the protruding portion passes through the conducting portion.

In certain embodiments, a thickness of the conducting portion is equal to the thickness of the connecting portion, the circuit board is provided with a plurality of conducting sheets, and a bottom end of the conducting portion is in contact with a corresponding one of the conducting sheets.

In certain embodiments, a thickness of the conducting portion is greater than the thickness of the contact portion, the circuit board is provided with a plurality of conducting sheets, the conducting portion is concavely provided with a plurality of grooves, and a plurality of solders are correspondingly accommodated in the grooves and are soldered to a same conducting sheet of the conducting sheets.

In certain embodiments, each of the terminals has a plurality of elastic arms formed by bending upward from the connecting portion and a plurality of contact portions, each of the contact portions is formed by bending upward and extending from a corresponding one of the elastic arms, and the contact portions of a same terminal upward abut a same conductive sheet of the conducting sheets of the circuit board.

In certain embodiments, a trench is formed between two adjacent elastic arms of the same terminal, the trench is formed by laser cutting, and a width of the trench is less than a thickness of each of the elastic arms.

In certain embodiments, the terminals comprise at least one signal terminal and at least one power terminal.

Compared with the related art, certain embodiments of the present invention have the beneficial effects:

The contact portion, the elastic arm, the connecting portion and the conducting portion are integrally formed, such that they are tightly connected and cannot be loosened. Further, the thickness of the connecting portion is greater than the thickness of the contact portion, so as to adjust the impedance of the terminal to a proper range to meet the requirement of impedance matching, thereby improving the high-frequency transmission performance of the electrical connector.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
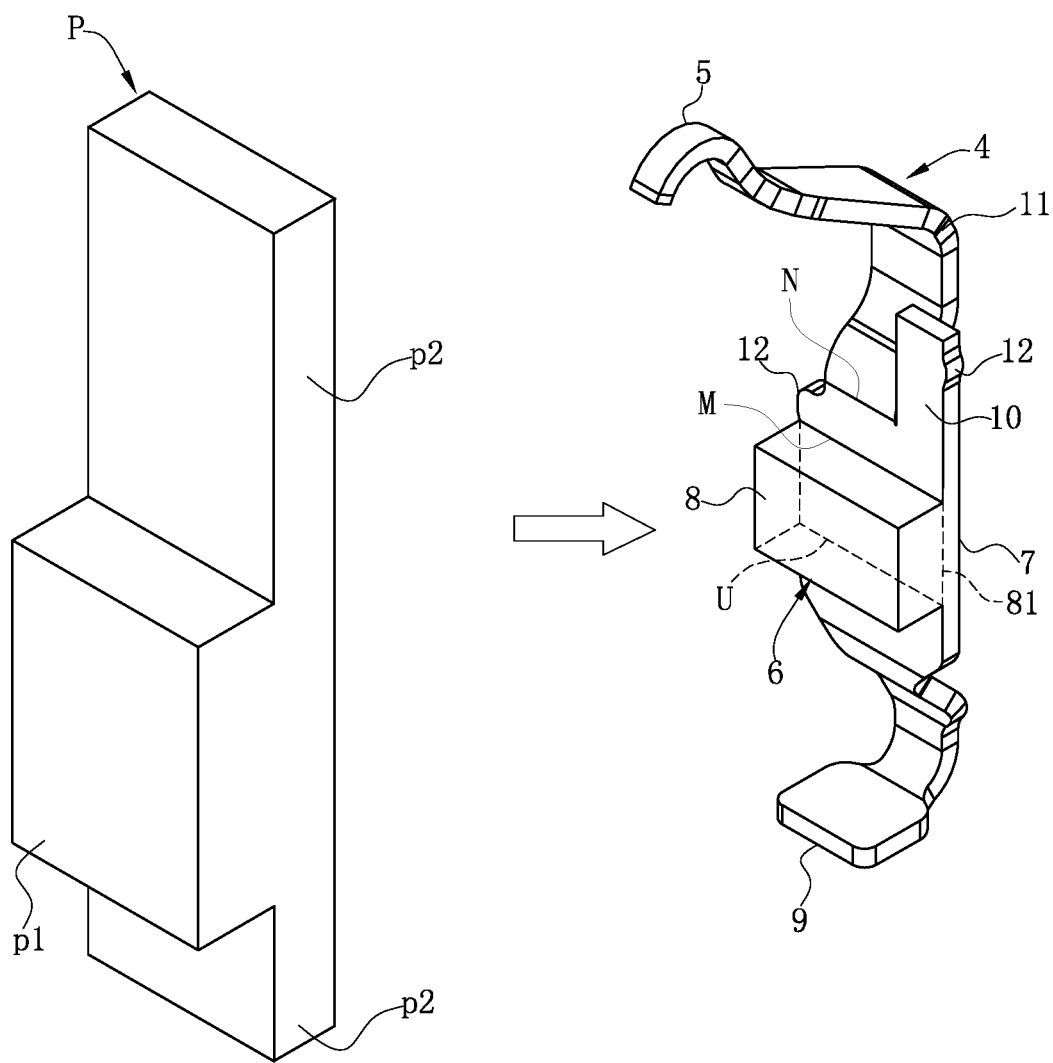
FIG. 1 is a schematic view of a terminal formed by a thick-thin material in an electrical connector according to the first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-13. In accordance with the purposes of this invention, as embodied and broadly described herein, this invention, in one aspect, relates to an electrical connector.

FIG. 1 to FIG. 4 show an electrical connector 100 according to the first embodiment of the present invention, which is used for electrically connecting a chip module 13 to a circuit board 15, and includes the following main elements: a plurality of terminals 4 and an insulating body 1 for accommodating the terminals 4.

As shown in FIG. 1, each terminal 4 is formed by cutting from a thick-thin material P, and the thick-thin material P has a thin portion p2 and a thick portion p1 protrudingly provided on the thin portion p2.

Figure 2:
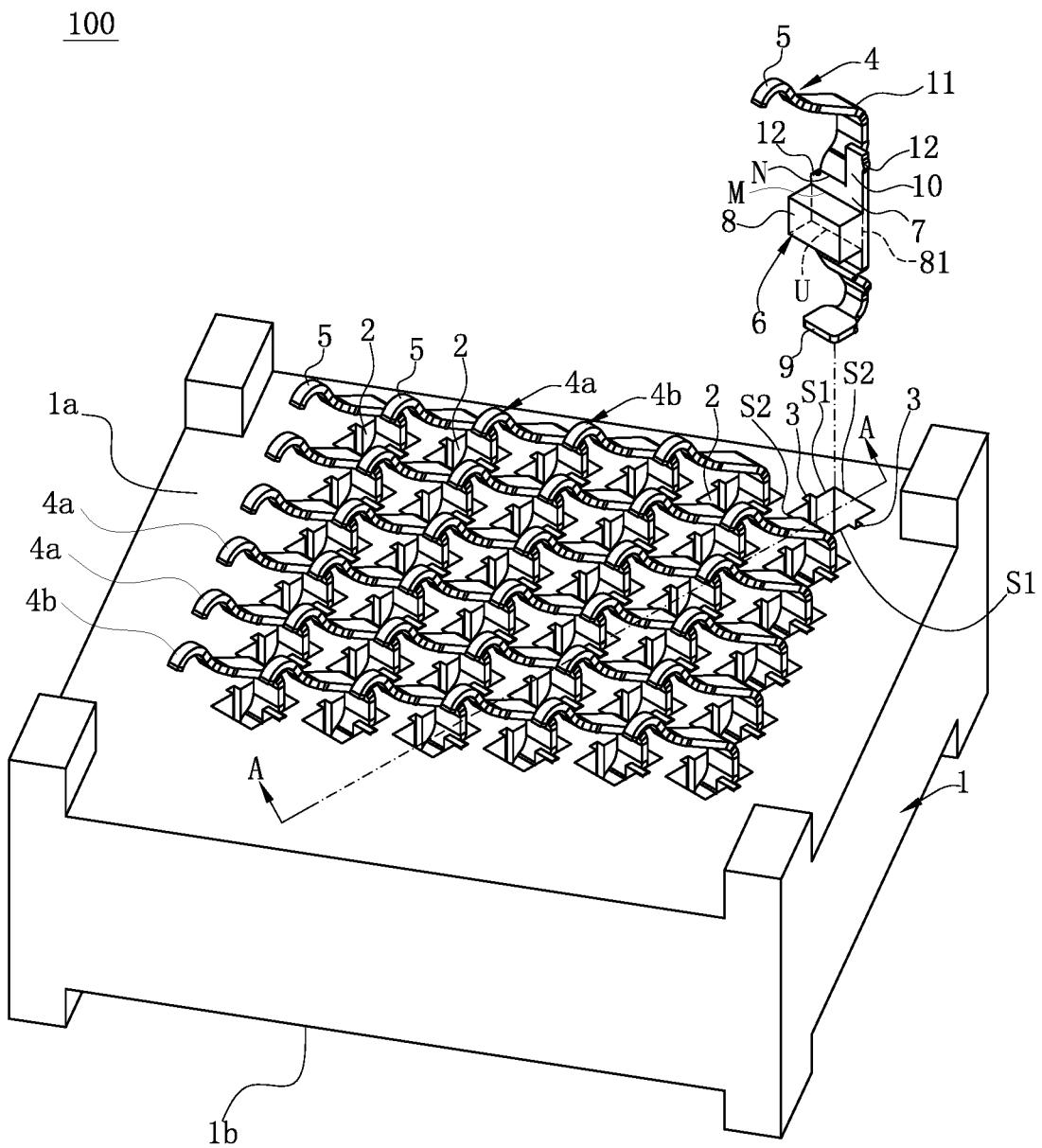
FIG. 2 is a perspective view of the electrical connector according to the first embodiment of the present invention.

Further referring to FIG. 1 and FIG. 2, the terminals 4 include a plurality of signal terminals 4a and a plurality of power terminals 4b, and the signal terminals 4a and the power terminals 4b have the same structure. In other embodiments, the terminals 4 include one signal terminal 4a and a plurality of power terminals 4b, or the terminals 4 include one power terminal 4b and a plurality of signal terminals 4a, or the terminals 4 only include one signal terminal 4a and one power terminal 4b. Each terminal 4 includes a connecting portion 6, and the connecting portion 6 has a main body portion 7 and a protruding portion 8 protruding from the main body portion 7 along a thickness direction. A top end M of the protruding portion 8 is lower than a top end N of the main body portion 7. The top end M of the protruding portion 8 and a bottom end U of the protruding portion 8 are both connected to the main body portion 7. The protruding portion 8 has a connecting surface 81 connecting the top end M of the protruding portion 8 and the bottom end U pf the protruding portion 8, and the connecting surface 81 is located on the main body portion 7. The protruding portion 8 is formed by cutting the thick portion p1, and the main body portion 7 of the terminal 4 is formed by cutting the thin portion p2.

Each terminal 4 further includes an elastic arm 11 and a strip connecting portion 10 extending upward side-by-side from the main body portion 7. The strip connecting portion 10 as a whole is located above the protruding portion 8 to be connected to a strip W. Each terminal 4 is provided with two engagement points 12 at two sides of the terminal 4. In this embodiment, the two engagement points 12 are respectively provided on the strip connecting portion 10 and the main body portion 7. Each terminal 4 also includes a contact portion 5 bending upward and extending from the elastic arm 11, and a conducting portion 9 bending and extending from the main body portion 7. The bottom end of the conducting portion 9 is provided in a horizontal flat plate shape. The elastic arm 11, the strip connecting portion 10 and the conducting portion 9 are all formed by cutting the thin portion p2.

Figure 3:
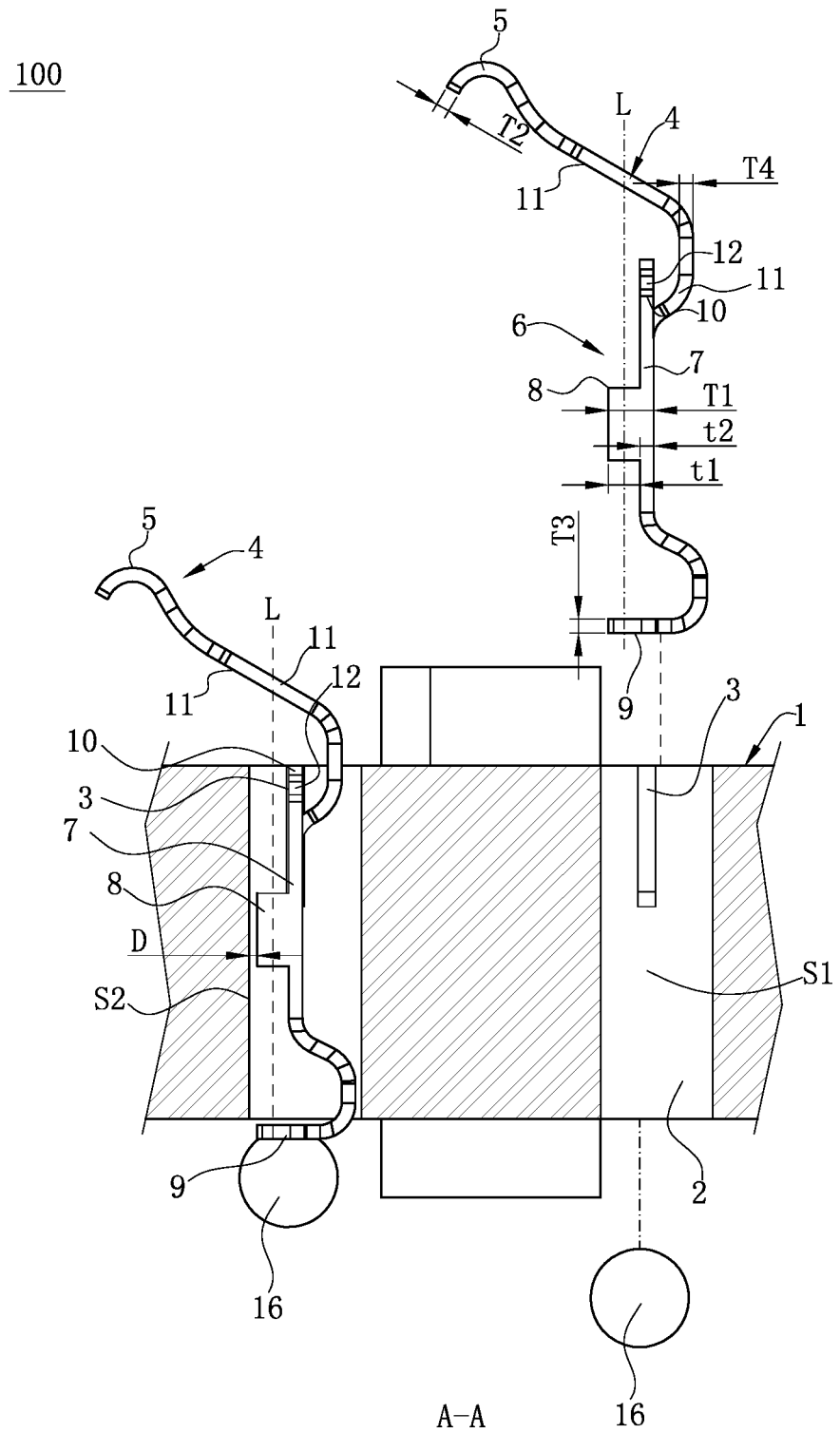
FIG. 3 is a partial sectional view along the A-A direction in FIG. 2.

Referring to FIG. 3, which clearly shows a side view of the connecting portion 6. A thickness T1 of the connecting portion 6 is greater than a thickness T2 of the contact portion 5 and a thickness T3 of the conducting portion 9, such that the connecting portion 6 has a larger volume. A thickness t1 of the protruding portion 8 is greater than a thickness t2 of the main body portion 7. A longitudinal axis L of the protruding portion 8 extends upward to pass through the elastic arm 11 and extends downward to pass through the conducting portion 9, such that the elastic arm 11 and the conducting portion 9 are evenly provided at two sides of the longitudinal axis L, the structure is compact, a smaller space is occupied, and the arrangement density of the terminals 4 can be improved.

As shown in FIG. 2 and FIG. 3, the insulating body 1 is provided with an upper surface 1a and a lower surface 1b opposite to each other and a plurality of terminal holes 2 running through the upper surface 1a and the lower surface 1b vertically. The upper surface 1a faces a chip module 13, and the lower surface 1b faces a circuit board 15. Each terminal hole 2 is provided with two first side walls S1 opposite to each other and two second side walls S2 respectively connected to the two first side walls S1, and each of the two first side walls S1 is provided with an engagement slot 3.

As shown in FIG. 2 and FIG. 3, the terminals 4 are assembled in the terminal holes 2 from top to bottom, and the engagement points 12 are fastened in the corresponding engagement slots 3 to position the terminals 4 in the terminal holes 2. In other embodiments, the connecting portions 6 also can fix the terminals 4 in the terminal holes 2 through other manners. A top end N of the main body portion 7 is lower than the upper surface 1a. The protruding portion 8 is clamped between the main body portion 7 and one of the two second side walls S2, and a gap D is formed between the protruding portion 8 and the corresponding second side wall S2 to avoid the interference between the protruding portion 8 and the corresponding second side wall S2, which results in the deflection of the terminal 4, and also avoid the protruding portion 8 from scratching the corresponding second side wall S2. The elastic arm 11 extends upward out of the corresponding terminal hole 2, such that the contact portion 5 is located outside the terminal hole 2. The conducting portion 9 extends downward out of the corresponding terminal hole 2, and a solder 16 is attached to the lower surface of the conducting portion 9, such that the conducting portion 9 is correspondingly soldered to a conducting sheet 17 of the circuit board 15.

Figure 4:
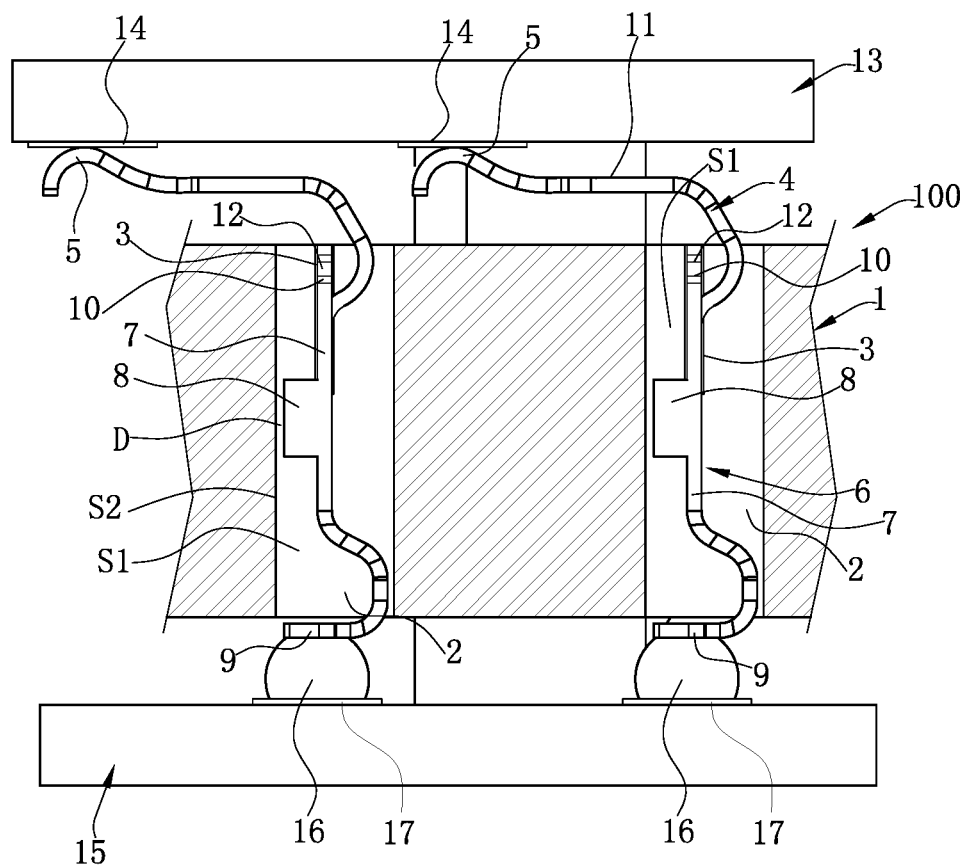
FIG. 4 is a schematic view of the electrical connector in FIG. 3 being electrically connected to a chip module and a circuit board.

As shown in FIG. 4, the electrical connector 100 is soldered to the circuit board 15 through the reflow of the solder 16. Then, the chip module 13 is pressed and connected to the electrical connector 100. A bottom surface of each of a plurality of conductive sheets 14 of the chip module 13 abuts a top surface of the corresponding contact portion 5, and the elastic arm 11 is compressed and deforms downward, such that the chip module 13 and the circuit board 15 are electrically conductively connected.

In this embodiment, the thick-thin material P can be purchased directly from raw material manufacturers, such that the connecting portion 6, the contact portion 5 and the conducting portion 9 of each terminal 4, which have different thicknesses, can be formed directly by an integrally cutting of the thick portions p1 and the thin portions p2 having different thicknesses of the thick-thin material P. All parts of each terminal 4 are tightly connected and cannot be loosened, such that the high-frequency performance is excellent, repeated assembly is not needed, and the production period of the terminal 4 is shortened.

In this embodiment, the thickness t2 of the main body portion 7 is equal to the thickness T2 of the contact portion 5, the thickness T3 of the conducting portion 9 and the thickness T4 of the elastic arm 11. In other embodiments, the thickness t2 of the main body portion 7 may be different from the thickness T2 of the contact portion 5 or the thickness T3 of the conducting portion 9. In this embodiment, only one protruding portion 8 is provided on the connecting portion 6. In other embodiments, there may be a plurality of protruding portions 8, and the protruding portions 8 can be respectively provided on the connecting portion 6 or the elastic arm 11 or the conducting portion 9.

In other embodiments (not shown), the terminals 4 can be integrally formed by powder metallurgy technology, 3D printing and the like, and the structure of each terminal 4 can be consistent with the structure of the terminals 4 as described in the above embodiment. As the new technologies become mature, the manufacturing process of the electrical connector 100 can be further optimized. For instance, after the insulating body 1 is formed, the terminals 4 can be directly formed in the terminal hole 2 by 3D printing, and assembly is not needed.

Figure 5:
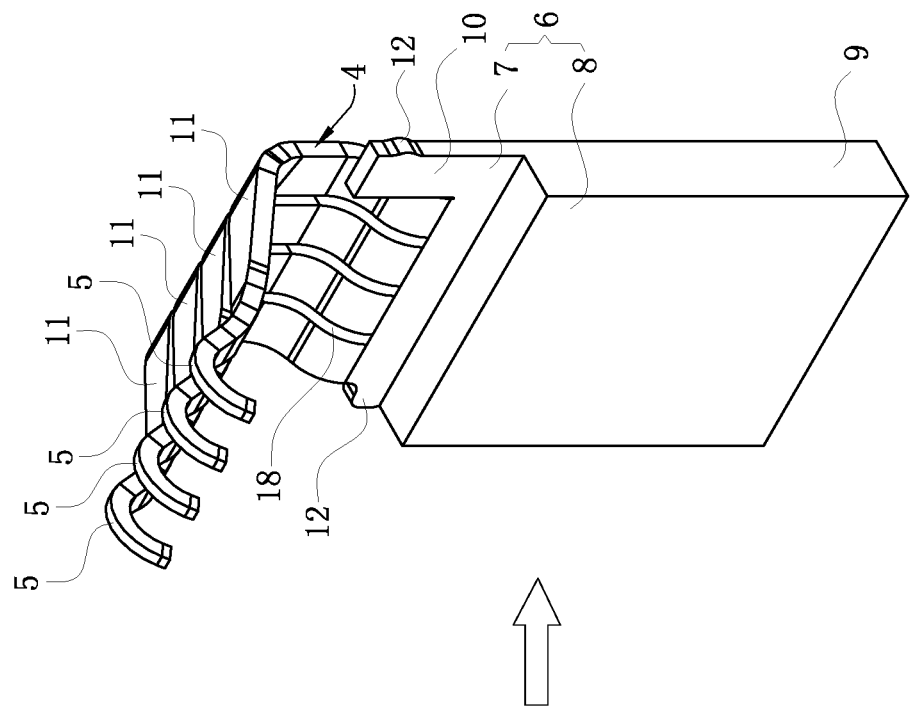
FIG. 5 is a schematic view of a terminal formed by a thick-thin material in an electrical connector according to the second embodiment of the present invention.
Figure 5:
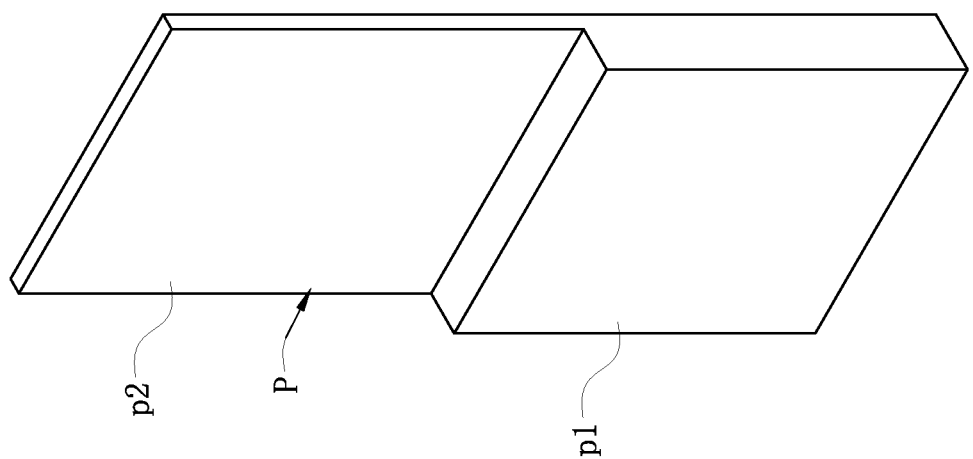
Figure 6:
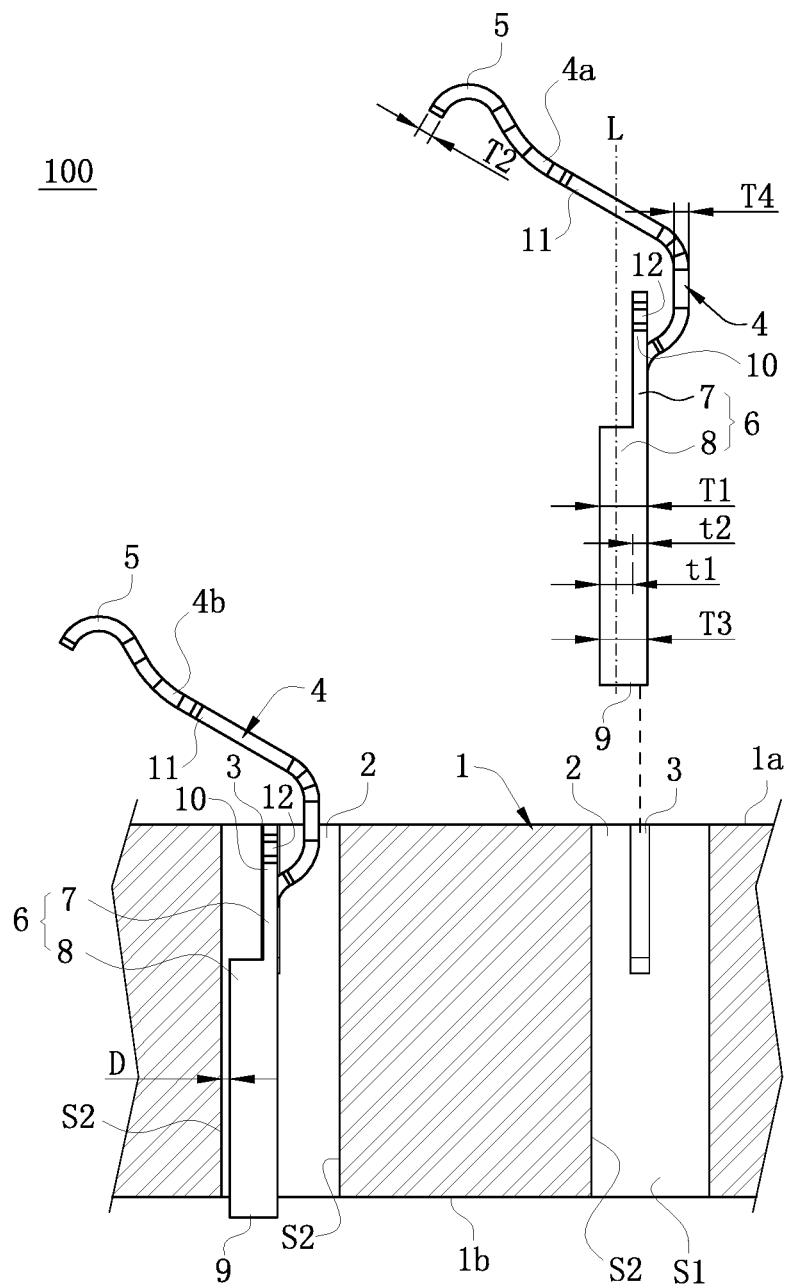
FIG. 6 is a schematic view of the electrical connector according to the second embodiment of the present invention.
Figure 7:
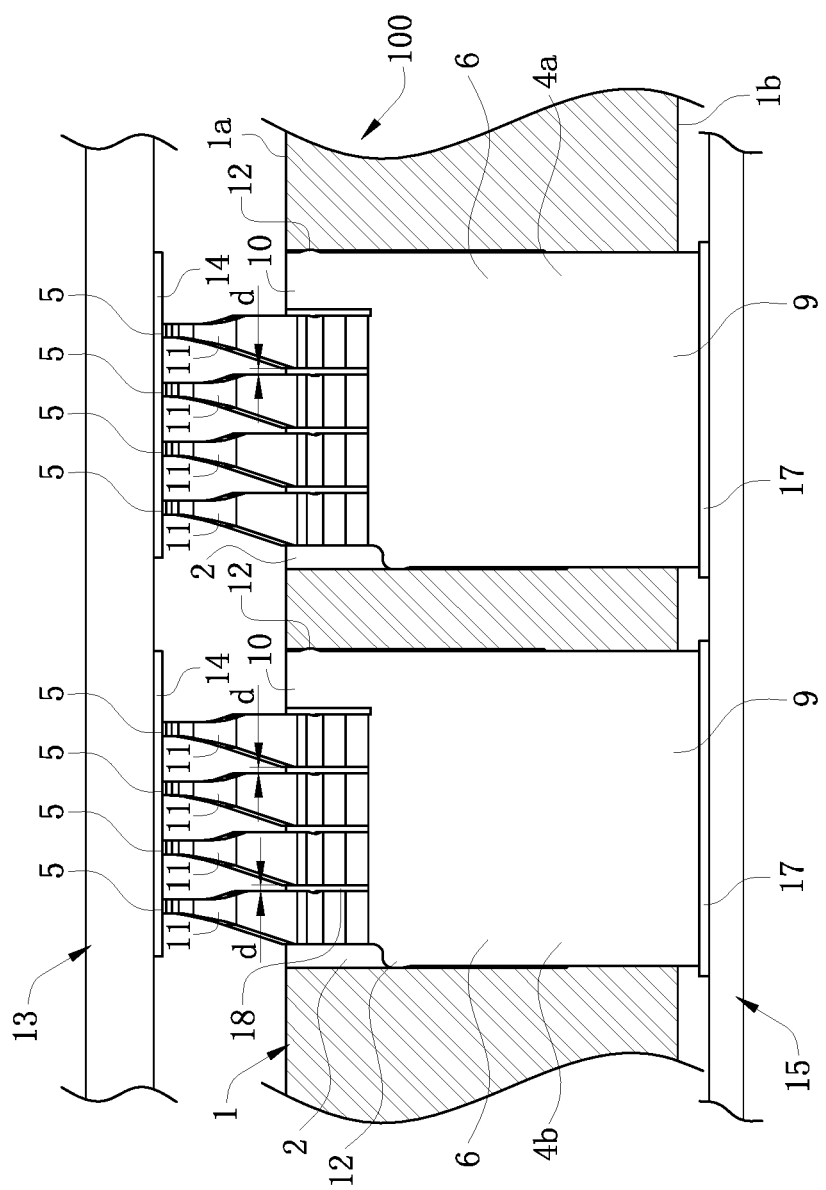
FIG. 7 is a schematic view of the electrical connector in FIG. 6 from another angle and being electrically connected to the chip module and the circuit board.

FIG. 5 to FIG. 7 show an electrical connector 100 according to the second embodiment of the present invention. The electrical connector 100 according to this embodiment is mainly different from the electrical connector 100 according to the first embodiment in that: each terminal 4 includes a plurality of elastic arms 11 bending upward from the connecting portion 6 and a plurality of contact portions 5, and each of the contact portions 5 is formed by bending upward and extending from a corresponding one of the elastic arms 11. The thickness T4 of each elastic arm 11 is identical. The thickness T2 of each contact portion 5 is identical and is equal to the thickness T4 of each elastic arm 11. A trench 18 is formed between two adjacent elastic arms 11 of the same terminal 4. The trench 18 is formed by laser cutting, and a width d of the trench 18 is less than the thickness T4 of each elastic arm 11. A plurality of contact portions 5 of the same terminal 4 upward abut the same conductive sheet 14. The conducting portion 9 extends downward vertically from the connecting portion 6. The thickness T3 of the conducting portion 9 is greater than the thickness T2 of each contact portion 5, and is equal to the thickness T1 of the connecting portion 6. The bottom end of the conducting portion 9 is in contact with the corresponding conducting sheet 17 of the circuit board 15. Other structures in the second embodiment are the same as those in the first embodiment, and are thus not elaborated herein.

Figure 8:
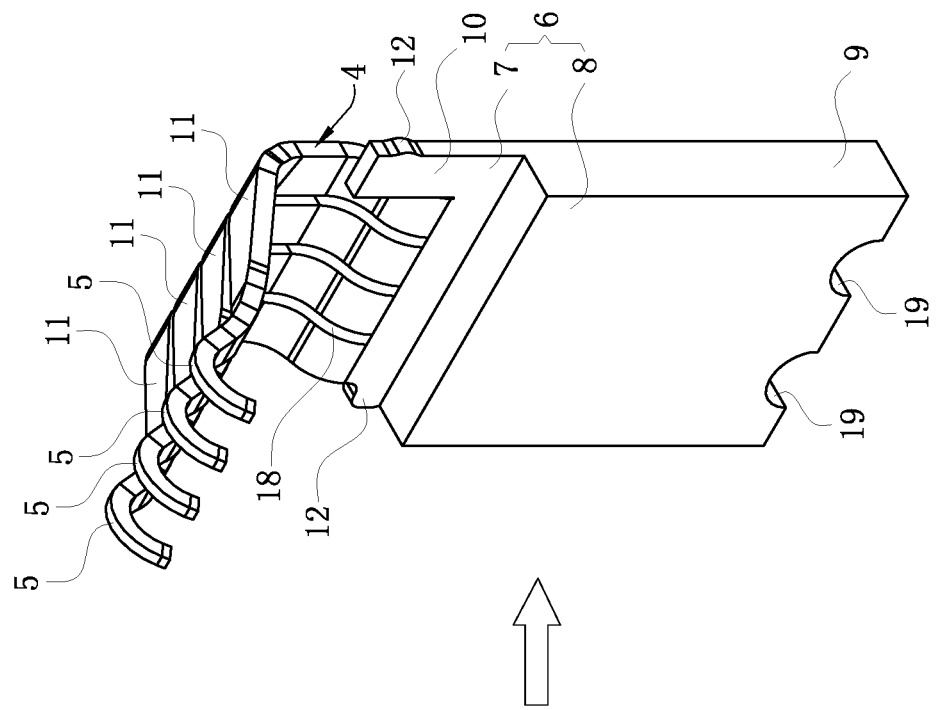
FIG. 8 is a schematic view of a terminal formed by a thick-thin material in an electrical connector according to the third embodiment of the present invention.
Figure 8:
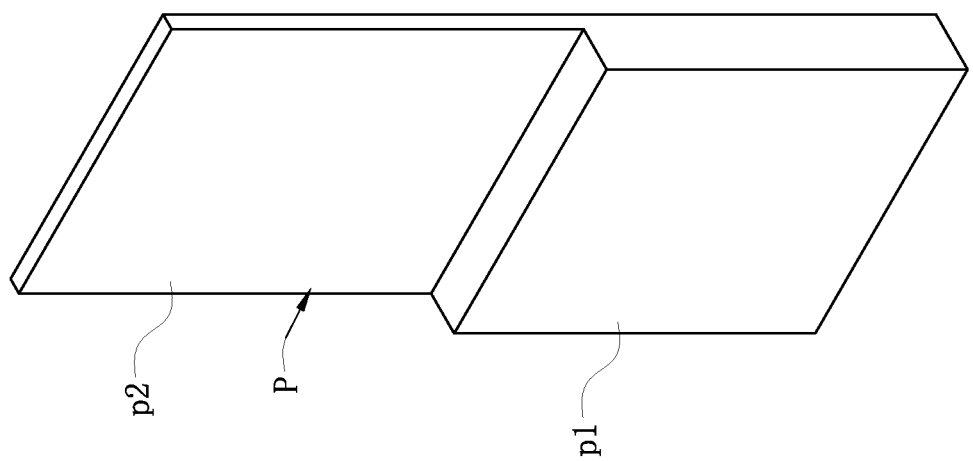
Figure 9:
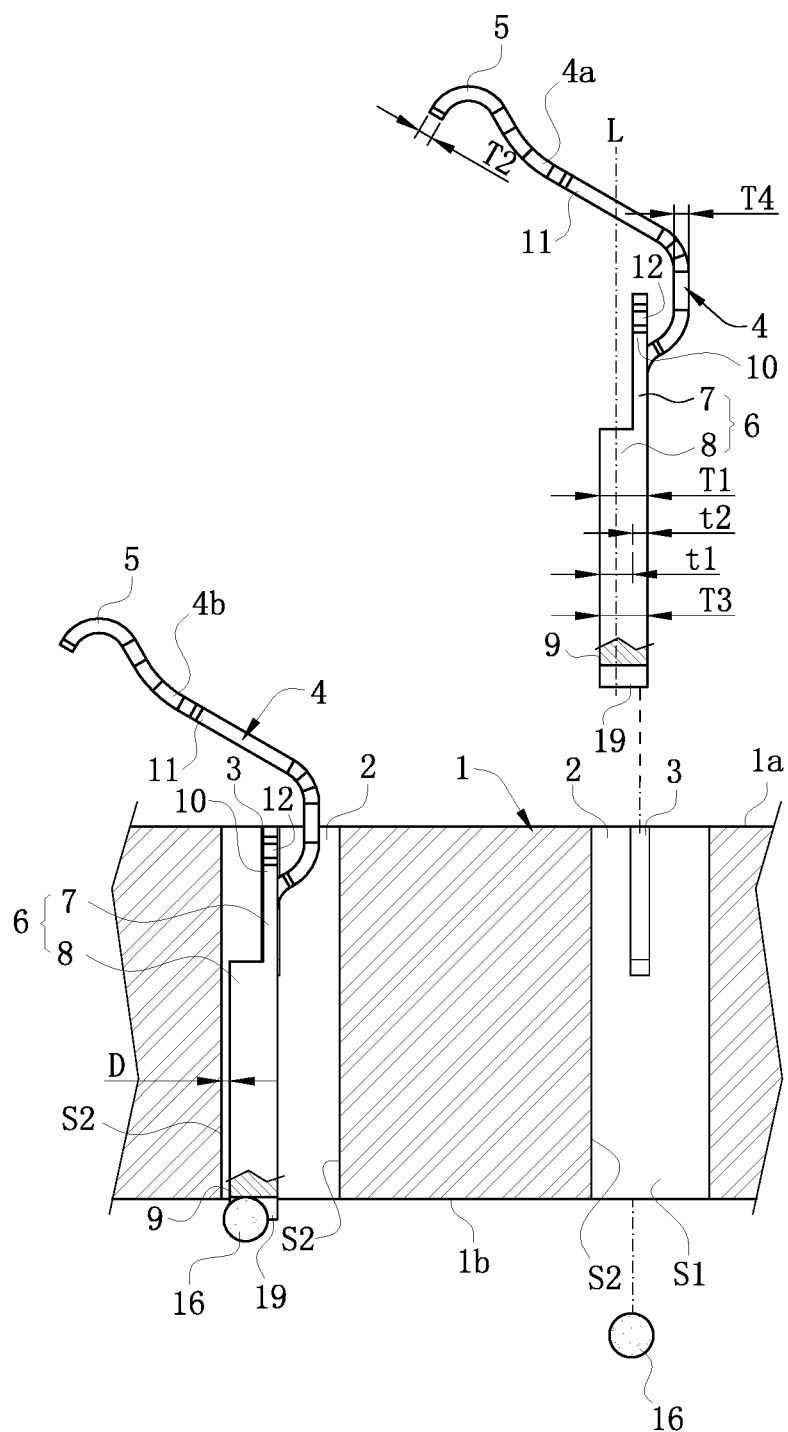
FIG. 9 is a schematic view of the electrical connector according to the third embodiment of the present invention.
Figure 10:
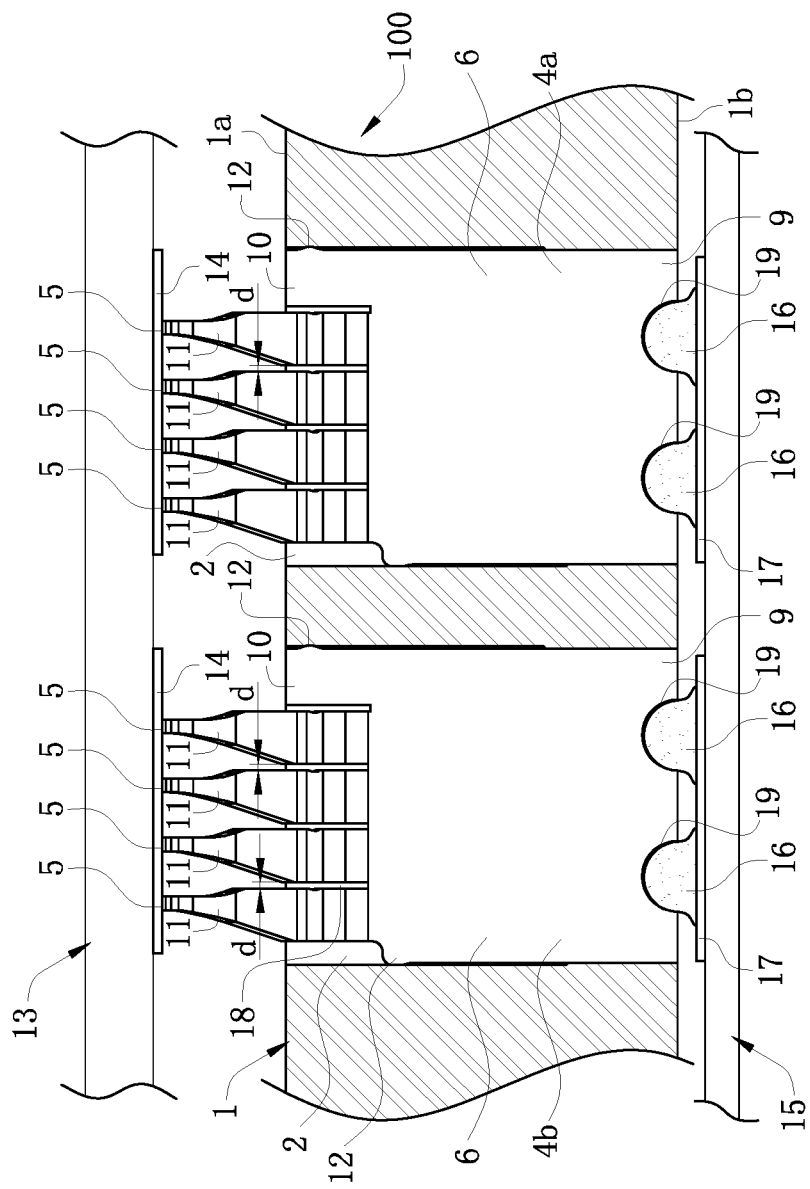
FIG. 10 is a schematic view of the electrical connector in FIG. 9 from another angle and being electrically connected to the chip module and the circuit board.

FIG. 8 to FIG. 10 show an electrical connector 100 according to the third embodiment of the present invention. The electrical connector 100 according to this embodiment is mainly different from the electrical connector 100 according to the second embodiment in that: a plurality of grooves 19 are concavely provided upward on the bottom end of the conducting portion 9, and a plurality of solders 16 are correspondingly accommodated in the grooves 19 and are soldered to the same conducting sheet 17 of the circuit board 15. Other structures in the third embodiment are the same as those in the second embodiment, and are thus not elaborated herein.

Figure 11:
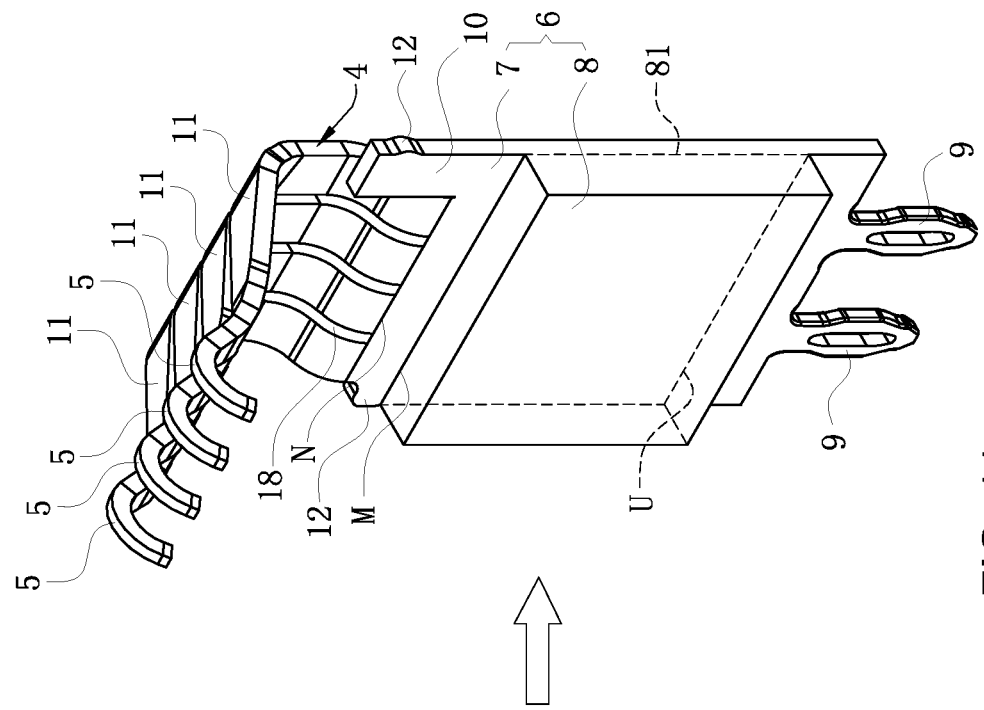
FIG. 11 is a schematic view of a terminal formed by a thick-thin material in an electrical connector according to the fourth embodiment of the present invention.
Figure 11:
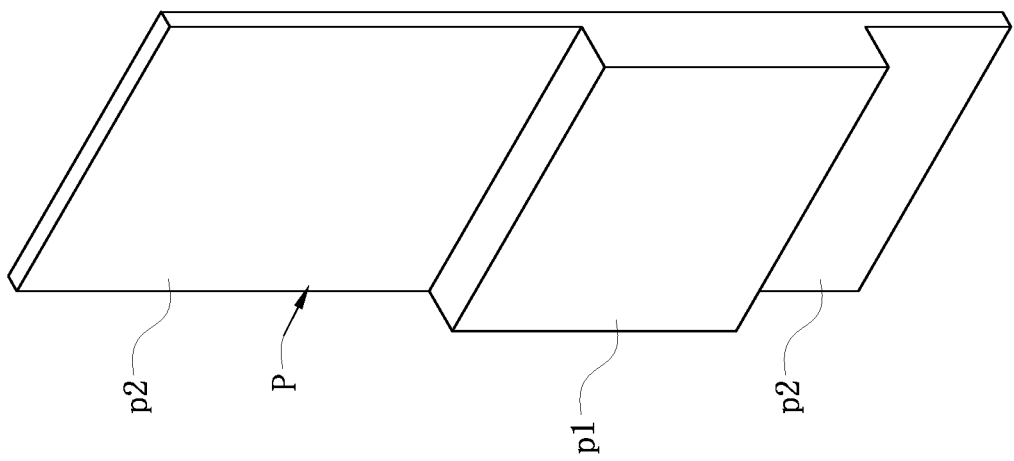
Figure 12:
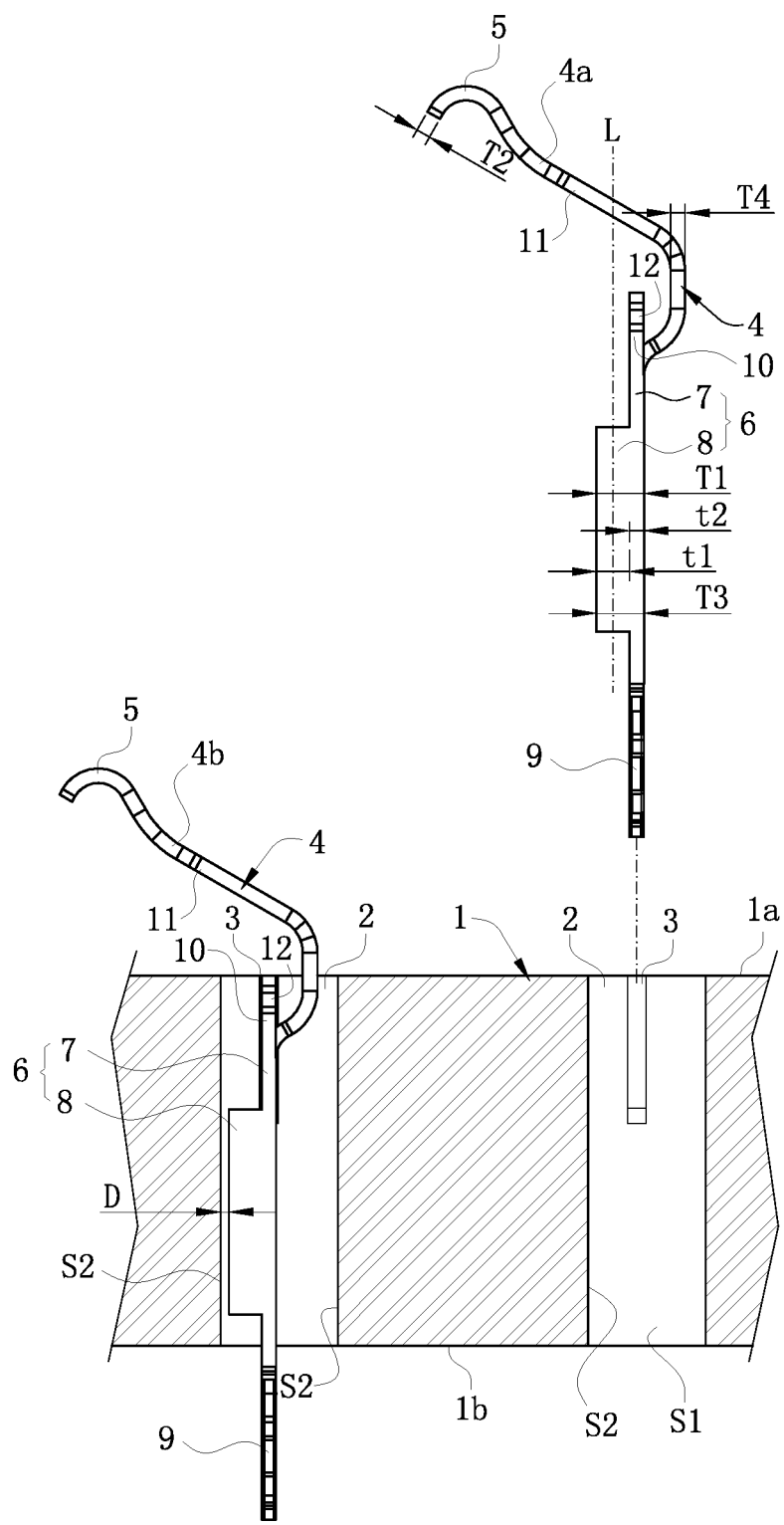
FIG. 12 is a schematic view of the electrical connector according to the fourth embodiment of the present invention.
Figure 13:
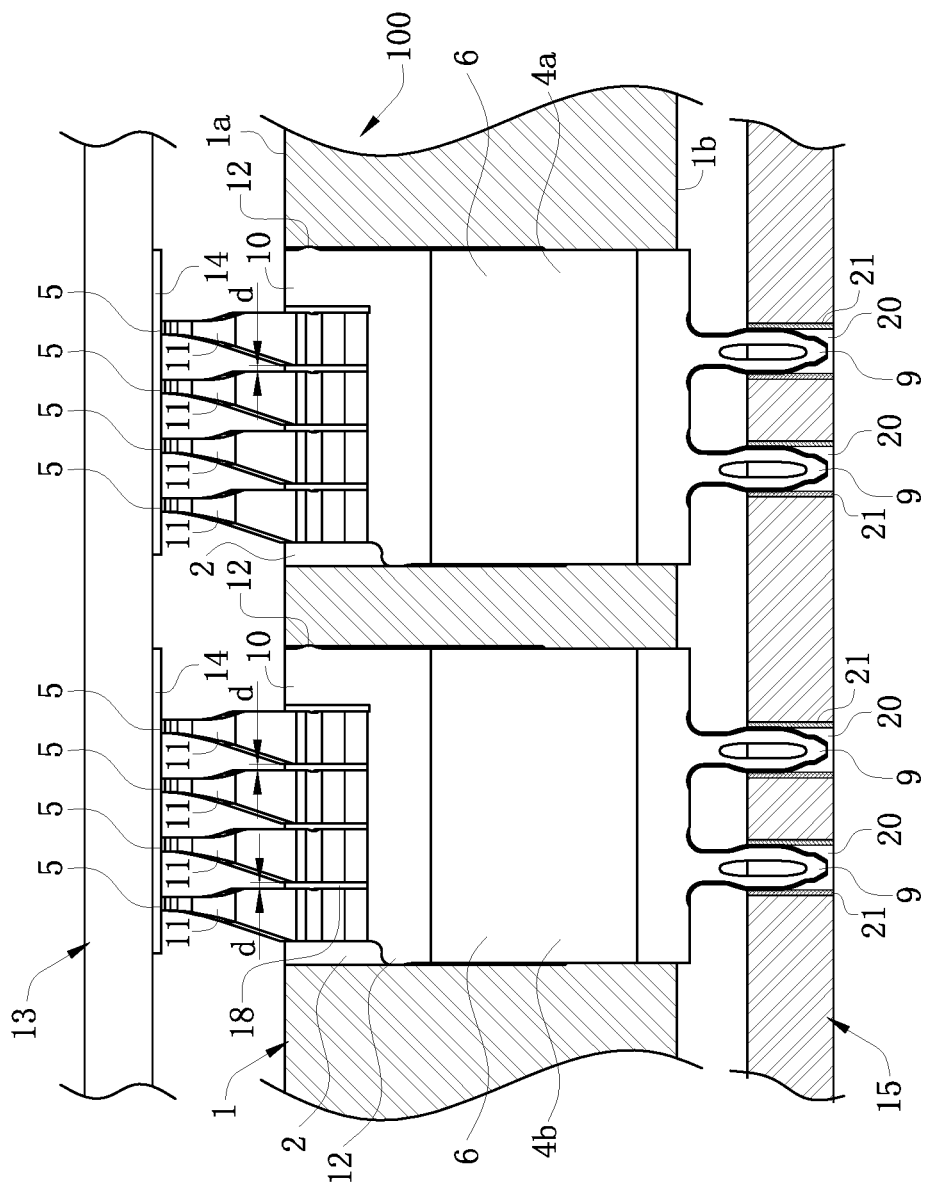
FIG. 13 is a schematic view of the electrical connector in FIG. 12 from another angle and being electrically connected to the chip module and the circuit board.

FIG. 11 to FIG. 13 show the electrical connector 100 according to the fourth embodiment of the present invention. The electrical connector 100 according to this embodiment is mainly different from the electrical connector 100 according to the second embodiment in that: the top end M of the protruding portion 8 and a bottom end U of the protruding portion 8 are both connected to the main body portion 7. The connecting surface 81 connects the top end M of the protruding portion 8 and the bottom end U of the protruding portion 8, and the connecting surface 81 is located on the main body portion 7. Each terminal 4 includes two conducting portions 9 extending downward vertically from the connecting portion 6. Each conducting portion 9 is a fish-eye structure, and the thickness T3 of each conducting portion 9 is less than the thickness T1 of the connecting portion 6 and is equal to the thickness T4 of each elastic arm 11. In other embodiments, one or more than two conducting portions 9 may be provided. The circuit board 15 is provided with a plurality of insertion holes 20 running through the circuit board 15 vertically, and each insertion hole 20 corresponds to one conducting portion 9. Each conducting portion 9 is in interference fit with the corresponding insertion hole 20 and is conductively connected to a conductive layer 21 in the insertion hole 20. Other structures in the fourth embodiment are the same as those in the second embodiment, and are thus not elaborated herein.

To sum up, the electrical connector according to certain embodiments of the present invention have the following beneficial effects:

1. The contact portion 5, the elastic arm 11, the connecting portion 6 and the conducting portion 9 are integrally formed, such that they are tightly connected and cannot be loosened. Further, the thickness of the connecting portion 6 is greater than the thickness of the contact portion 5, so as to adjust the impedance of the terminal 4 to a proper range to meet the requirement of impedance matching of the electrical connector 100, thereby improving the high-frequency transmission performance of the electrical connector 100.

2. The terminal 4 is formed by cutting the thick-thin material P. The thickness T1 of the connecting portion 6 is greater than the thickness T2 of the contact portion 5 and the thickness T3 of the conducting portion 9, such that the connecting portion 6 has a larger volume, thereby reducing the self-inductance of the terminal 4, shortening the distance between the connecting portions 6 of adjacent terminals 4, increasing the capacitance of the electrical connector 100, and reducing the impedance of the electrical connector 100, so as to improve the high-frequency performance. Meanwhile, both the thickness T2 of the contact portion 5 and the thickness T3 of the conducting portion 9 are less than the thickness T1 of the connecting portion 6, such that the contact portion 5 and the conducting portion 9 have better elasticity.

3. In a side projection of the connecting portion 6, a longitudinal axis L of the protruding portion 8 passes through the elastic arm 11, such that the elastic arm 11 is evenly provided at two sides of the longitudinal axis L. Comparing to the case where the elastic arm 11 is completely provided at one side of the longitudinal axis L, the structure is compact, and a smaller space is occupied.

4. A gap D is formed between the protruding portion 8 and the second side wall S2 of the corresponding terminal hole 2, such that when the terminal 4 is assembled in the corresponding terminal hole 2, the protruding portion 8 cannot interfere with the second side wall S2 to avoid deflection of the terminal 4 so as to avoid poor flatness of the terminals 4.

5. Each terminal 4 is provided with a plurality of elastic arms 11, which are correspondingly conductively connected to the same conducting sheet 17, thereby further improving the high-frequency transmission performance between the electrical connector 100 and the chip module 13.

6. The thickness T3 of the conducting portion 9 is equal to the thickness T1 of the connecting portion 6, and the bottom end of the conducting portion 9 is in contact with the conducting sheet 17, thereby further improving the high-frequency transmission performance between the electrical connector 100 and the circuit board 15.

7. The thickness T1 of the connecting portion 6 of the power terminal 4b is greater, thus enhancing the high temperature resistance of the power terminal 4b, thereby allowing the power terminal 4b to transmit higher current.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector configured to electrically connect a chip module having a plurality of conductive sheets to a circuit board, the electrical connector comprising:
    an insulating body, having an upper surface and a lower surface opposite to each other and a plurality of terminal holes running through the upper surface and the lower surface, wherein the upper surface faces the chip module, and the lower surface faces the circuit board; and
    a plurality of terminals, wherein each of the terminals has a connecting portion correspondingly located in a corresponding one of the terminal holes, a conducting portion formed by extending from the connecting portion and configured to conduct the circuit board, an elastic arm formed by bending upward and extending from the connecting portion and extending upward out of the corresponding one of the terminal holes, and a contact portion formed by bending upward and extending from the elastic arm, and wherein when the chip module is pressed downward, a bottom surface of each of the conductive sheets downward abuts a top surface of the contact portion, and the elastic arm is compressed and deforms downward;
    wherein the contact portion, the elastic arm, the connecting portion and the conducting portion are integrally formed, and a thickness of the connecting portion is greater than a thickness of the contact portion, and
    wherein the connecting portion has a main body portion and a protruding portion protruding from the main body portion along a thickness direction of the main body portion, the elastic arm bends upward and extends from the main body portion, a thickness of the main body portion is equal to a thickness of the elastic arm, a strip connecting portion is formed by extending from the main body portion to be connected to a strip, and the strip connecting portion as a whole is higher than the protruding portion.

2. The electrical connector according to claim 1, wherein the thickness of the connecting portion is greater than a thickness of the elastic arm.

3. The electrical connector according to claim 1, wherein the thickness of the connecting portion is greater than a thickness of the conducting portion.

4. The electrical connector according to claim 3, wherein the circuit board is provided with a plurality of insertion holes, each of the insertion holes corresponds to the conducting portion of one of the terminals, and the conducting portion of each of the terminals is a fish-eye structure and is in interference fit with a corresponding one of the insertion holes.

5. The electrical connector according to claim 1, wherein a thickness of the protruding portion is greater than the thickness of the main body portion.

6. The electrical connector according to claim 1, wherein in a side projection of the connecting portion, a longitudinal axis of the protruding portion passes through the elastic arm.

7. The electrical connector according to claim 1, wherein in a side projection of the connecting portion, a longitudinal axis of the protruding portion passes through the conducting portion.

8. The electrical connector according to claim 1, wherein a thickness of the conducting portion is equal to the thickness of the connecting portion, the circuit board is provided with a plurality of conducting sheets, and a bottom end of the conducting portion is in contact with a corresponding one of the conducting sheets.

9. The electrical connector according to claim 1, wherein a thickness of the conducting portion is greater than the thickness of the contact portion, the circuit board is provided with a plurality of conducting sheets, the conducting portion is concavely provided with a plurality of grooves, and a plurality of solders are correspondingly accommodated in the grooves and are soldered to a same conducting sheet of the conducting sheets.

10. The electrical connector according to claim 1, wherein the terminals comprise at least one signal terminal and at least one power terminal.

11. The electrical connector according to claim 1, wherein a top end of the main body portion is lower than the upper surface, the thickness of the main body portion is equal to the thickness of the contact portion and a thickness of the conducting portion, a top end of the protruding portion and a bottom end of the protruding portion are connected to the main body portion, the top end of the protruding portion is lower than the top end of the main body portion, the protruding portion has a connecting surface connecting the top end of the protruding portion and the bottom end of the protruding portion, and the connecting surface is located on the main body portion.

12. An electrical connector configured to electrically connect a chip module having a plurality of conductive sheets to a circuit board, the electrical connector comprising:
    an insulating body, having an upper surface and a lower surface opposite to each other and a plurality of terminal holes running through the upper surface and the lower surface, wherein the upper surface faces the chip module, and the lower surface faces the circuit board; and
    a plurality of terminals, wherein each of the terminals has a connecting portion correspondingly located in a corresponding one of the terminal holes, a conducting portion formed by extending from the connecting portion and configured to conduct the circuit board, an elastic arm formed by bending upward and extending from the connecting portion and extending upward out of the corresponding one of the terminal holes, and a contact portion formed by bending upward and extending from the elastic arm, and wherein when the chip module is pressed downward, a bottom surface of each of the conductive sheets downward abuts a top surface of the contact portion, and the elastic arm is compressed and deforms downward;

wherein the contact portion, the elastic arm, the connecting portion and the conducting portion are integrally formed, and a thickness of the connecting portion is greater than a thickness of the contact portion, and wherein the connecting portion has a main body portion and a protruding portion protruding from the main body portion along a thickness direction of the main body portion, the elastic arm bends upward and extends from the main body portion, a thickness of the main body portion is equal to a thickness of the elastic arm, the protruding portion is clamped between the main body portion and a side wall of the corresponding one of the terminal holes, and a gap is formed between the protruding portion and the side wall.

13. The electrical connector according to claim 12, wherein a top end of the main body portion is lower than the upper surface, the thickness of the main body portion is equal to the thickness of the contact portion and a thickness of the conducting portion, a top end of the protruding portion and a bottom end of the protruding portion are connected to the main body portion, the top end of the protruding portion is lower than the top end of the main body portion, the protruding portion has a connecting surface connecting the top end of the protruding portion and the bottom end of the protruding portion, and the connecting surface is located on the main body portion.

14. The electrical connector according to claim 12, wherein in a side projection of the connecting portion, a longitudinal axis of the protruding portion passes through the elastic arm.

15. The electrical connector according to claim 12, wherein a thickness of the conducting portion is greater than the thickness of the contact portion, the circuit board is provided with a plurality of conducting sheets, the conducting portion is concavely provided with a plurality of grooves, and a plurality of solders are correspondingly accommodated in the grooves and are soldered to a same conducting sheet of the conducting sheets.

16. An electrical connector configured to electrically connect a chip module having a plurality of conductive sheets to a circuit board, the electrical connector comprising:

an insulating body, having an upper surface and a lower surface opposite to each other and a plurality of terminal holes running through the upper surface and the lower surface, wherein the upper surface faces the chip module, and the lower surface faces the circuit board; and a plurality of terminals, wherein each of the terminals has a connecting portion correspondingly located in a corresponding one of the terminal holes, a conducting portion formed by extending from the connecting portion and configured to conduct the circuit board, an elastic arm formed by bending upward and extending from the connecting portion and extending upward out of the corresponding one of the terminal holes, and a contact portion formed by bending upward and extending from the elastic arm, and wherein when the chip module is pressed downward, a bottom surface of each of the conductive sheets downward abuts a top surface of the contact portion, and the elastic arm is compressed and deforms downward;

wherein the contact portion, the elastic arm, the connecting portion and the conducting portion are integrally formed, and a thickness of the connecting portion is greater than a thickness of the contact portion, and wherein each of the terminals has a plurality of elastic arms formed by bending upward from the connecting portion and a plurality of contact portions, each of the contact portions is formed by bending upward and extending from a corresponding one of the elastic arms, and the contact portions of a same terminal upward abut a same conductive sheet of the conducting sheets of the circuit board.

17. The electrical connector according to claim 16, wherein a trench is formed between two adjacent elastic arms of the same terminal, the trench is formed by laser cutting, and a width of the trench is less than a thickness of each of the elastic arms.

18. The electrical connector according to claim 16, wherein a thickness of the conducting portion is equal to the thickness of the connecting portion, the circuit board is provided with a plurality of conducting sheets, and a bottom end of the conducting portion is in contact with a corresponding one of the conducting sheets.

19. The electrical connector according to claim 16, wherein a thickness of the conducting portion is greater than the thickness of the contact portion, the circuit board is provided with a plurality of conducting sheets, the conducting portion is concavely provided with a plurality of grooves, and a plurality of solders are correspondingly accommodated in the grooves and are soldered to a same conducting sheet of the conducting sheets.

20. The electrical connector according to claim 16, wherein the connecting portion has a main body portion and a protruding portion protruding from the main body portion along a thickness direction of the main body portion, the elastic arm bends upward and extends from the main body portion, a thickness of the main body portion is equal to a thickness of the elastic arm, a top end of the main body portion is lower than the upper surface, a top end of the protruding portion and a bottom end of the protruding portion are connected to the main body portion, the top end of the protruding portion is lower than the top end of the main body portion, the protruding portion has a connecting surface connecting the top end of the protruding portion and the bottom end of the protruding portion, and the connecting surface is located on the main body portion.

* * * * *